United States Patent
Ohkawa et al.

[11] Patent Number: 5,989,970
[45] Date of Patent: Nov. 23, 1999

[54] METHOD FOR FABRICATING SEMICONDUCTOR DEVICE HAVING THIN-FILM RESISTOR

[75] Inventors: Makoto Ohkawa, Toyoake; Makio Iida, Ichinomiya; Mikimasa Suzuki, Toyohashi, all of Japan

[73] Assignee: Nippondenso Co., Ltd., Kariya, Japan

[21] Appl. No.: 08/774,796

[22] Filed: Dec. 30, 1996

Related U.S. Application Data

[63] Continuation of application No. 08/463,550, Jun. 5, 1995, abandoned.

[30] Foreign Application Priority Data

Jun. 8, 1994 [JP] Japan .................................. 6-126115

[51] Int. Cl.⁶ .................................................. H01L 21/70
[52] U.S. Cl. ........................... 438/384; 438/381; 438/382
[58] Field of Search ................................... 438/381, 382, 438/384

[56] References Cited

U.S. PATENT DOCUMENTS

| | | |
|---|---|---|
| 4,510,178 | 4/1985 | Paulson et al. . |
| 4,591,821 | 5/1986 | Paulson et al. . |
| 4,700,465 | 10/1987 | Sirkin . |
| 5,013,677 | 5/1991 | Hozumi . |
| 5,030,588 | 7/1991 | Hosaka . |
| 5,043,295 | 8/1991 | Ruggerio et al. . |
| 5,128,745 | 7/1992 | Takasu et al. . |
| 5,310,695 | 5/1994 | Suzuki . |
| 5,420,063 | 5/1995 | Maghsoudnia et al. . |
| 5,503,878 | 4/1996 | Suzuki et al. . |
| 5,525,831 | 6/1996 | Ohkawa et al. . |
| 5,552,342 | 9/1996 | Itou et al. . |

FOREIGN PATENT DOCUMENTS

| | | |
|---|---|---|
| 0350961 | 1/1990 | European Pat. Off. . |
| 0443575 | 8/1991 | European Pat. Off. . |
| 63-229717 | 9/1983 | Japan . |
| 59-214240 | 12/1984 | Japan . |
| 60-261101 | 12/1985 | Japan . |
| 3-8368 | 1/1986 | Japan . |
| 63-096948 | 4/1988 | Japan . |
| 63-119549 | 5/1988 | Japan . |
| 63-227047 | 9/1988 | Japan . |
| 2-58259 | 2/1990 | Japan . |
| 2-20364 | 12/1990 | Japan . |
| 3-012960 | 1/1991 | Japan . |
| 3-104118 | 5/1991 | Japan . |
| 4-44259 | 2/1992 | Japan . |
| 4-44260 | 2/1992 | Japan . |
| 5-029547 | 2/1993 | Japan . |
| 5-90501 | 4/1993 | Japan . |
| 5-211357 | 8/1993 | Japan . |

OTHER PUBLICATIONS

John L. Vossen and Werner Kern, Thin Film Processes II, 1991.
S. M. Sze, VLSI Technology, 1988.
S.Wolf, "Silicon Processing for the VLSI Era," vol. II 1990, pp. 103–110, 192, 335, Jun. 1990.
Translation of JP 2–104118, May 1991.
S.Wolf & R.N. Tauber, "Silicon Processing for the VLSI Era," vol. I, pp. 541,542, 581, Jun. 1990.

*Primary Examiner*—Charles Bowers
*Assistant Examiner*—Martin Sulsky
*Attorney, Agent, or Firm*—Pillsbury Madison & Sutro, LLP

[57] ABSTRACT

Even when a contact hole is formed before thin-film resistor formation, a contact area exposed in the contact hole is prevented from damaging. A semiconductor element is formed in a silicon semiconductor substrate and an oxide film is formed on the surface of the semiconductor substrate. Then, a contact hole is formed on the oxide film and moreover, a CrSiN film serving as a thin-film resistor and a TiW film serving as a barrier metal are formed on the oxide film. The TiW film is patterned by a mask and the CrSiN film is patterned through chemical dry etching. Finally, an Al electrode is formed on the semiconductor element and the CrSiN film through the contact hole and moreover a protective film is formed thereon.

12 Claims, 4 Drawing Sheets

METHOD FOR FABRICATING SEMICONDUCTOR DEVICE HAVING THIN-FILM RESISTOR

CROSS REFERENCE TO RELATED APPLICATION

This is a continuation of application Ser. No. 08/463,550, filed Jun. 5, 1995, abandoned.

This application is based upon and claims the benefit of priority of the prior Japanese Patent application No. 6-126115 filed on Jun. 8, 1994, the contents of which are incorporated herein by reference.

BACKGROUND OF THE INVENTION

1. Field of the Invention

The present invention relates to a method for fabricating a semiconductor device having a thin-film resistor.

2. Related Arts

Various thin-film resistors made of a CrSi compound or the like integrated on an IC are hitherto proposed. For example, as shown in EP-A-0350961 or EP-A-0443575, such thin-film resistor is formed as follows: a layer insulating film is formed on a substrate with a semiconductor element; a thin-film material such as CrSi compound or the like is deposited; after patterning the thin-film material into the thin-film resistor, a contact hole is formed on the layer insulating film; and a wiring electrode made of aluminum or the like is formed.

That is, a thin-film resistor is constituted and thereafter a contact hole is formed. This is because of the following reason. Although two types of methods such as wet etching and dry etching are considered as methods for patterning a CrSi film, the dry etching method is more prospective because wet etching has a problem that fluctuation of etching of the CrSi film increases. In the case of normal dry etching using plasma, however, if a contact hole opens in an element area when patterning a thin-film resistor, the semiconductor exposed area is damaged. Specifically, a problem occurs that plasma under dry etching collides with the element area exposed in the contact hole to cause an element defect and an imperfect contact with an electrode, i.e., an open circuit. Therefore, a contact hole should be formed after a thin-film resistor is patterned.

However, when forming a contact hole after CrSi patterning, it is clarified that the following problem occurs. That is, when forming a contact hole after depositing and patterning a CrSi thin-film resistor, as shown in FIG. 5A (in this figure, CrSi thin-film resistor is not shown), photoresist 8 is formed on a layer insulating film 2 to use it as an etching mask. In this case, the adhesiveness of the photoresist 8 is deteriorated because surface chapping occurs under etching of CrSiN film performed in the preceding process and thereby, the photoresist 8 is lifted due to peeling. Therefore, when forming a contact hole through wet etching, the layer insulting film 2 is excessively etched, and the contact hole expands to expose the p-n junction formed on the semiconductor substrate 1 as shown in FIG. 5B.

SUMMARY OF THE INVENTION

The present invention is made to solve the above problem and an objective thereof is to provide a thin-film resistor fabrication method which makes it possible to accurately form a contact hole without damaging a contact area.

To achieve the above objective, the present invention comprises the steps of: forming a semiconductor element in a semiconductor substrate; forming an insulating film on the surface of the semiconductor substrate; forming a contact hole on the insulating film; depositing a thin-film resistor material on the insulating film having the contact hole; patterning the deposited thin-film resistor material to form a thin-film resistor by means of chemical dry etching; and forming electrodes respectively contacting the semiconductor element via the contact hole and the thin-film resistor.

Either of wet etching and dry etching can be applied to the step of forming a contact hole. Particularly when forming a contact hole by means of dry etching, the contact hole can be decreased in diameter and thereby, a wiring pattern can be decreased in width. In this case, by performing annealing between contact hole formation and thin-film resistor formation, the edge of a contact hole is rounded and the step coverage of a wiring electrode is improved.

It is also possible to form a barrier metal on a thin-film resistor and thereafter performing the thin-film resistor patterning, thereby connecting the electrode and the thin-film resistor via the barrier metal. In this case, it is preferable to light-etching the surface of the thin-film resistor after patterning the barrier metal and thereafter chemical-dry-etching the thin-film resistor. The light-etching makes it possible to remove etching residue from the barrier metal.

As described above, according to the present invention, a contact hole is formed on a insulating film and thereafter a thin-film resistor is formed on the insulating film. Furthermore, the thin-film resistor is patterned through chemical dry etching. Therefore, because a thin-film resistor is deposited and patterned after forming a contact hole, the contact hole can be formed at a high shape accuracy. Moreover, even though a contact area is exposed in a contact hole when the patterning of the thin-film resistor is carried out, because the thin-film resistor is patterned by means of chemical dry etching, it is possible to prevent the contact area from damaging during dry etching.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

The present invention is described below by referring to the embodiments shown in the accompanying drawings.

FIGS. 1A to 1F are sectional views of processes showing the method of the first embodiment of the present invention for fabricating a semiconductor device having a thin-film resistor. FIG. 2 is an illustration showing a chemical dry etching system.

Figure 1A:
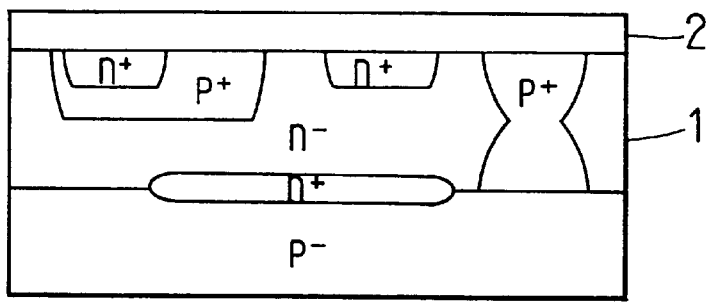
FIGS. 1A through 1F are sectional views showing the processes of the method of a first embodiment of the present invention for fabricating a semiconductor device having a thin-film resistor.
Figure 1B:
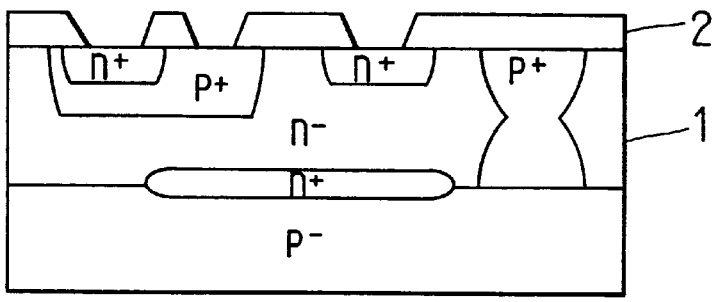
Figure 1C:
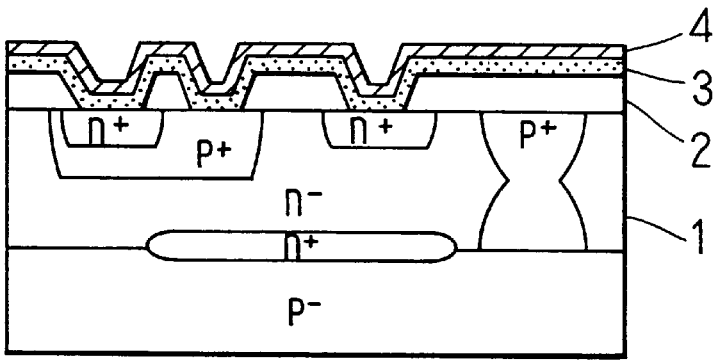
Figure 1D:
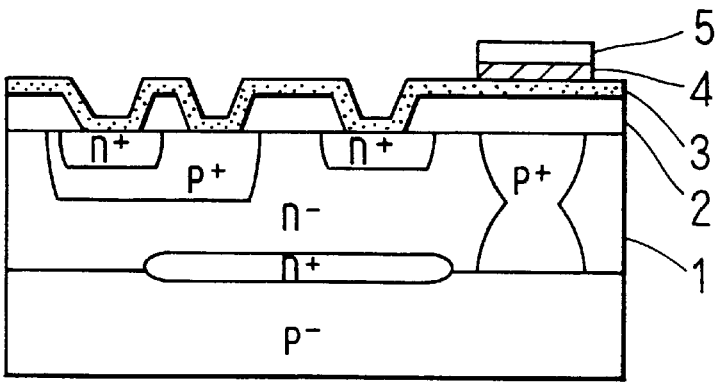
Figure 2:
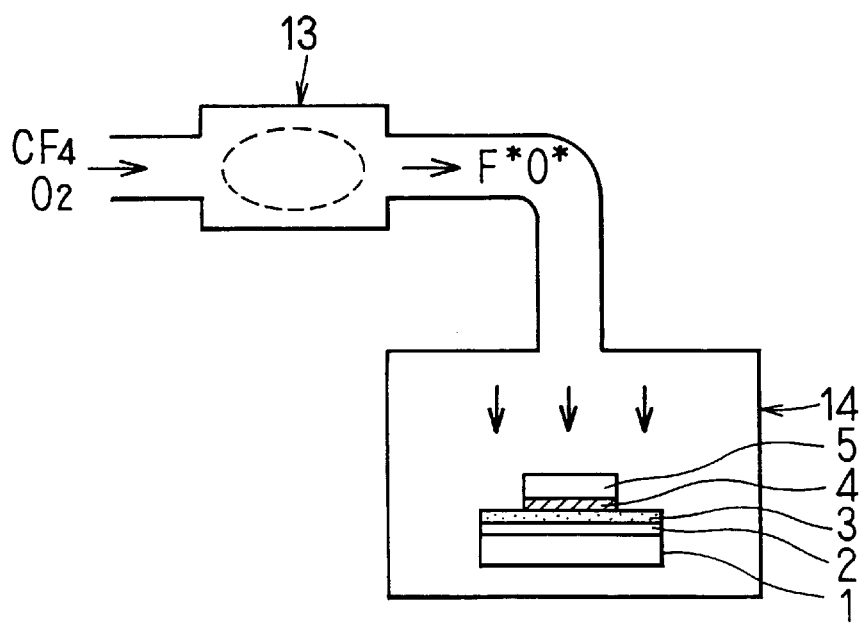
FIG. 2 is a typical diagram showing a chemical dry etching apparatus used for the process shown in FIG. 1E.

First, as shown in FIG. 1A, a semiconductor element is formed on a semiconductor substrate 1 and thereafter a silicon oxide film 2 is formed on the surface of the substrate 1 as an insulating film. Then, a contact hole is formed by means of wet etching (FIG. 1B). This wet etching is performed by using an etching solution of $HF:NH_4F=1:6$ similarly to normal wet etching. Then, a CrSiN film 3 serving as a thin-film resistor is deposited up to approximately 15 nm by means of sputtering and moreover a TiW film 4 serving as a barrier metal is formed (FIG. 1C). Then, photoresist 5 is formed and thereafter the TiW film 4 is patterned by means of wet etching so that a resistance area remains (FIG. 1D). It is preferable to perform the wet etching of the TiW film 4 at the room temperature for approximately 30 min by using an etching solution of $H_2O_2:H_2O=1:1$.

Figure 1E:
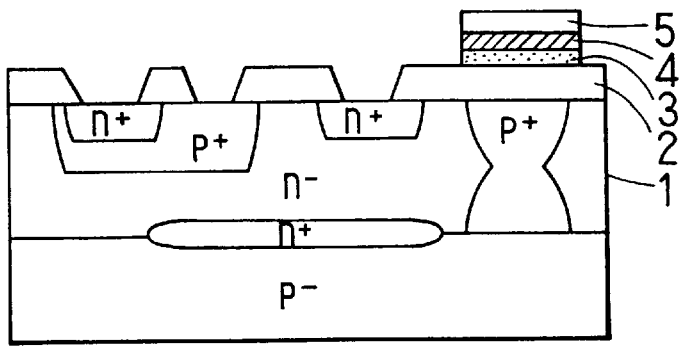

Then, the CrSiN film 3 is patterned by means of chemical dry etching by using the photoresist 5 and TiW film 4 as masks (FIG. 1E). Specifically, $CF_4$ and oxygen are introduced into an etching system called a chemical dry etching system at flow rates of 40 SCCM and 360 SCCM respectively to etch the CrSiN film 3 on the oxide film 2 for an etching time of 260 sec by generating plasma at a pressure of 30 Pa and a power of 500 W. The chemical dry etching system, as shown in FIG. 2, has, separately, a plasma generation chamber 13 and an etching chamber 14, which performs etching by recombining ions in the plasma generation chamber 13 and introducing only radicals into the etching chamber 14.

That is, though normal dry etching uses both physical etching with plasma and chemical etching with radicals, chemical dry etching uses chemical etching using chemical reactions with radicals. In this case, oxygen introduced into the chemical dry etching system has a function for relatively increasing the number of fluorine radicals contributing to chemical etching by promoting the re-combination of the ions in the plasma generation chamber 13. When setting the mixture ratio of oxygen to 70% or more, the etching selectivity of CrSiN 3 to the underlying $SiO_2$ is improved. Moreover, in a case of using PSG as the insulating film 2, it is preferable to set the mixture ratio of oxygen to 75% or more.

Figure 1F:
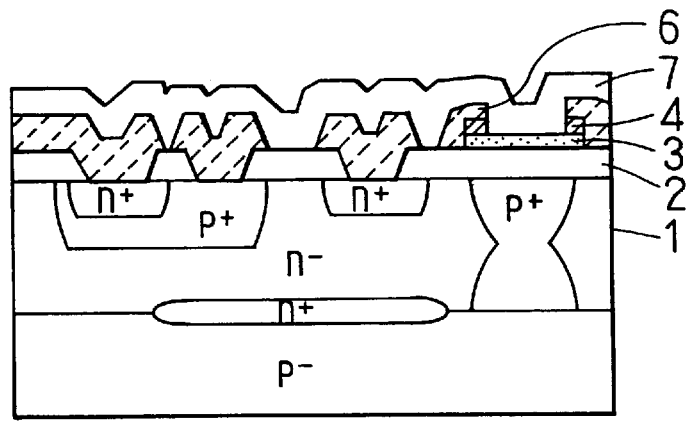

After removing the photoresist 5, a semiconductor element is electrically connected with the CrSiN film 3 through a contact hole as shown in FIG. 1F. That is, an Al electrode 6 is formed as wiring. Thereafter, a protective film (e.g. a film with a two-layer structure of a PSG film and a plasma nitride film) 7 is formed to constitute a semiconductor device.

Therefore, the first embodiment makes it possible to form the CrSiN film 3 without damaging a contact area due to a chemical reaction caused by chemical dry etching because a contact hole is formed and thereafter the CrSiN film 3 serving as a thin-film resistor is patterned by means of the chemical dry etching. Moreover, it is possible to accurately form the contact hole.

The second embodiment of the present invention is described below.

In the case of the second embodiment, a contact hole is formed by means of dry etching in order to miniaturize the width of a wiring pattern.

Figure 3A:
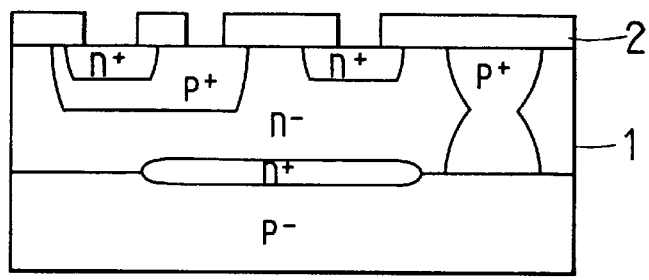
FIGS. 3A and 3B are sectional views showing partial processes of a second embodiment of the present invention.

That is, a contact hole is formed by means of dry etching process shown in FIG. 3A instead of the process shown in FIG. 1B. For example, the hole is formed through plasma etching by using $CHF_3/C_2F_6/He$ based gas and setting a gas flow rate and an RF power to proper values.

Figure 3B:
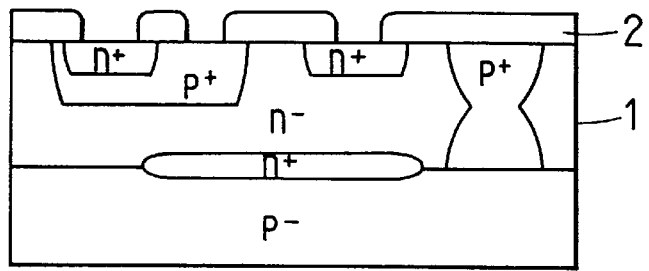
Figure 5A:
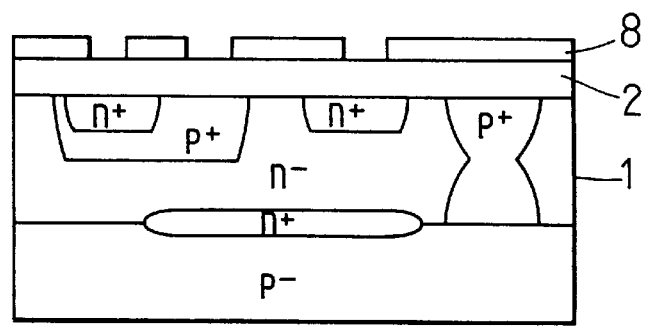
FIGS. 5A and 5B are sectional views for explaining problems when forming a contact hole by a conventional fabrication method.
Figure 5B:
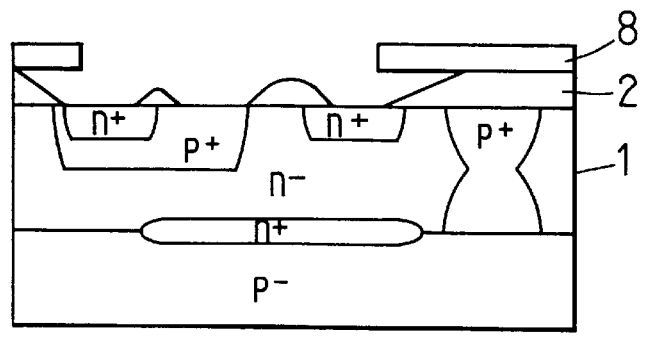

Moreover, after the etching, the contact hole is annealed at around 900° C. to round the top of the contact hole as shown in FIG. 3B. This roundness improves the step coverage of the Al electrode 6. Thereafter, the processes shown in FIG. 1C downward are executed.

The second embodiment makes it possible to decrease the width of a wiring pattern in addition to the advantage of the first embodiment because a contact hole is formed through dry etching. Moreover, because the contact hole is annealed before forming the CrSiN film 3, it is possible to prevent the characteristic of the CrSiN film 3 from changing.

Figure 4:
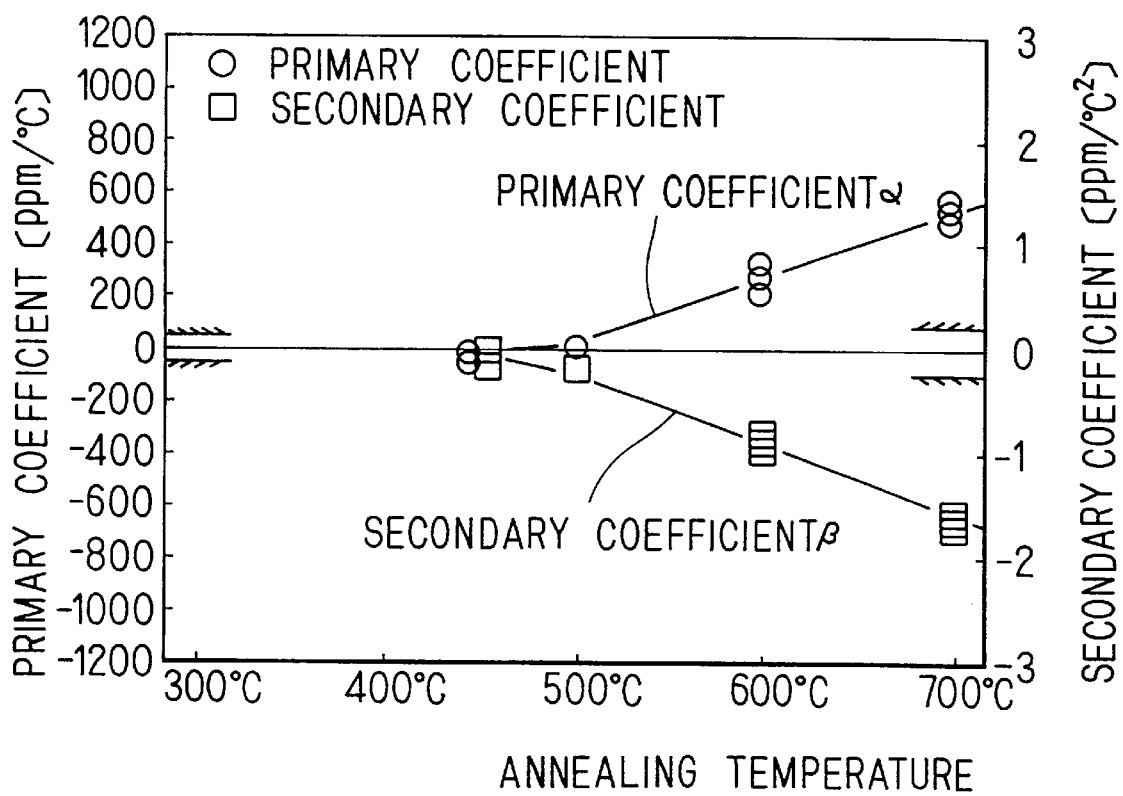
FIG. 4 is a characteristic diagram showing the relationship between annealing temperature and temperature coefficient for explaining a problem that the characteristic of the CrSiN film is changed due to annealing.

Even if a contact hole is formed through dry etching after forming a thin-film resistor as ever, it is difficult to decrease the diameter of the contact hole. This is because a problem occurs that the characteristic of the CrSiN film 3 changes due to annealing for rounding the top of the contact hole. That is, as shown in FIG. 4, a resistance-value change $\Delta R$ at a temperature T to a resistance value $R_{25}$ at the room temperature of 25° C. is expressed as $\Delta R/R_{25}=\alpha(T-25)+\beta(T-25)^2$, the temperature coefficients $\alpha$ and $\beta$ fluctuate at a temperature of 500° C. or higher. In the case of this embodiment, however, because the annealing can be performed before a thin-film resistor is formed, thermal treatment at 500° C. or higher is not performed after forming the CrSiN film 3 and therefore a problem such as fluctuation of a resistance value does not occur.

The third embodiment is described below.

When the inventors of the present invention patterned the TiW film 4 shown in FIG. 1D by means of wet etching and thereafter chemical-dry-etched the CrSiN film 3 as shown in FIG. 1E, a problem occurred that the CrSiN film 3 remained in an area to be etched because the etching of the CrSiN film 3 did not reach the oxide film 2 and thereby imperfect continuity might occur. As the result of studying the problem, it was found that the problem was caused by the fact that etching residue occurred when wet-etching the TiW film 4 (it is estimated that oxide of Ti or W is left) and thereby the CrSiN film 3 was not smoothly etched and thus the CrSiN film 3 was left.

Therefore, in the third embodiment, a light-etching process is added between the processes in FIGS. 1D and 1E. That is, light etching is performed by dipping at the room temperature for 15 sec into an etching solution of $H_2O_2:H_2O:NH_4OH=100:100:5$. That is, the etching rate of W is improved by adding an alkaline solution ($NH_4OH$) to the etching solution of the TiW film 4 and therefore TiW residue can be removed.

The light-etching process makes it possible to remove the etching residue of the TiW film 4. Therefore, it is possible to make the dry etching of the CrSiN film 3 securely reach the oxide film 2 and thus the problem of imperfect continuity can be solved. It is not preferable to use $NH_4OH$ for the etching process (FIG. 1D) of the TiW film 4 because the etching resistance of the photoresist 5 is deteriorated.

The above first to third embodiments use the CrSiN film 3 as a thin-film resistor. However, it is also possible to use a thin film made of other compound containing Cr and Si such as a CrSi film.

Moreover, it is possible to use a titanium-based material such as a titanium alloy mainly made of titanium other than the TiW film 4 as a barrier metal.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method for fabricating a semiconductor device having a thin-film resistor, comprising:

forming a semiconductor element in a semiconductor substrate;

forming an insulating film on a surface of said semiconductor substrate;

forming a contact hole to said semiconductor element in said insulating film;

depositing a thin-film resistor material on said insulating film and in said contact hole formed in said insulating film;

forming a barrier metal on said thin-film resistor material;

forming a mask on said barrier metal;

patterning said barrier metal by wet etching using said mask;

light-etching the surface of said thin-film resistor material after said patterning of said barrier metal;

after said light etching, patterning said deposited thin-film resistor material into a thin-film resistor by removing at least thin-film resistor material in said contact hole formed in said insulating film by means of chemical dry etching including patterning said thin-film resistor material into said thin-film resistor by chemical dry etching using said mask, said removing being performed in an etching chamber using radicals obtained by recombining ions generated in a plasma generation chamber, said etching chamber being separate from a plasma generation chamber; and forming electrodes contacting said thin-film resistor and contacting said semiconductor element via said contact hole.

2. The method according to claim 1, wherein said contact hole forming includes forming said contact hole by wet etching.

3. The method according to claim 1, wherein said contact hole forming includes forming said contact hole by dry etching.

4. The method according to claim 3, further comprising annealing to round the top of said contact hole after said dry etching.

5. The method according to claim 4, wherein said annealing is performed before said depositing of said thin-film resistor material.

6. The method according to any one of claims 1 through 5, wherein said depositing includes depositing a material of a compound containing Cr and Si.

7. The method according to any one of claims 1–5, wherein said barrier metal is TiW, and wherein said chemical dry etching uses $CF_4$ and oxygen.

8. The method according to any one of claims 1–5, wherein said light-etching includes dipping said resistor material at room temperature for 15 seconds into an etching solution of $H_2O_2:H_2O:NH_4OH=100:100:5$.

9. A method for fabricating a semiconductor device having a thin-film resistor, the method comprising:

forming a semiconductor element in a semiconductor substrate;

forming an insulating film on a surface of said semiconductor substrate;

depositing a thin-film resistor material on said insulating film;

forming a barrier metal on said thin-film resistor material;

patterning said barrier metal;

patterning said deposited thin-film resistor material into a thin-film resistor by means of chemical dry etching;

forming electrodes contacting said thin-film resistor and said semiconductor element; and light etching a surface of said thin-film resistor material after said patterning of said barrier metal;

wherein said patterning of said thin-film resistor material into said thin-film resistor is performed after said light-etching.

10. The method according to claim 9, wherein said depositing includes depositing a material of a compound containing Cr and Si.

11. The method according to claim 9 wherein said barrier metal is TiW, and wherein said chemical dry etching uses $CF_4$ and oxygen.

12. The method according to claim 9, wherein said light-etching includes dipping said resistor material at room temperature for 15 seconds into an etching solution of $H_2O_2:H_2O:NH_4OH=100:100:5$.

* * * * *